US011264441B2

(12) United States Patent
Jin et al.

(10) Patent No.: US 11,264,441 B2
(45) Date of Patent: Mar. 1, 2022

(54) ORGANIC LIGHT EMITTING DISPLAY APPARATUS AND METHOD OF MANUFACTURING THE ORGANIC LIGHT EMITTING DISPLAY APPARATUS

(71) Applicant: SAMSUNG DISPLAY CO., LTD., Yongin (KR)

(72) Inventors: Seong-Hyun Jin, Yongin (KR); Seong-Ho Kim, Yongin (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 52 days.

(21) Appl. No.: 14/477,744

(22) Filed: Sep. 4, 2014

(65) Prior Publication Data
US 2014/0377898 A1    Dec. 25, 2014

Related U.S. Application Data

(62) Division of application No. 13/244,205, filed on Sep. 23, 2011, now Pat. No. 8,841,670.

(30) Foreign Application Priority Data

Dec. 29, 2010    (KR) .................. 10-2010-0138038

(51) Int. Cl.
*H01L 27/32*    (2006.01)
*H01L 51/00*    (2006.01)
(Continued)

(52) U.S. Cl.
CPC ...... *H01L 27/3258* (2013.01); *H01L 27/3246* (2013.01); *H01L 27/3248* (2013.01); (Continued)

(58) Field of Classification Search
CPC ............. H01L 27/3258; H01L 27/3246; H01L 27/3248; H01L 27/3244; H01L 27/1259; H01L 51/56
See application file for complete search history.

(56) References Cited

U.S. PATENT DOCUMENTS 7,294,856 B2 * 11/2007 Ito .................. H01L 27/3246
257/13
7,656,087 B2    2/2010 Kim et al.
(Continued)

FOREIGN PATENT DOCUMENTS

CN        101794049 A    8/2010
JP        2006-210224 A    8/2006
(Continued)

OTHER PUBLICATIONS

Translation of KR 10-2005-0081219 (Year: 2005).*
(Continued)

*Primary Examiner* — Lauren R Bell
(74) *Attorney, Agent, or Firm* — F. Chau & Associates, LLC (57) ABSTRACT

An organic light emitting display apparatus includes a substrate; a thin film transistor which is disposed over the substrate; a first electrode which is disposed over the substrate and electrically connected to the thin film transistor; a passivation layer which covers the thin film transistor and contacts a predetermined region of an upper surface of the first electrode; an intermediate layer which is disposed over the first electrode, includes an organic emission layer, and contacts a predetermined region of the passivation layer; and a second electrode which is disposed over the intermediate layer.

10 Claims, 4 Drawing Sheets

(51) Int. Cl.
*H01L 51/56* (2006.01)
*H01L 27/12* (2006.01)

(52) U.S. Cl.
CPC .......... *H01L 51/0005* (2013.01); *H01L 51/56* (2013.01); *H01L 27/1259* (2013.01); *H01L 2227/323* (2013.01)

(56) References Cited

U.S. PATENT DOCUMENTS

| | | | |
|---|---|---|---|
| 8,106,402 B2 | 1/2012 | Yeo et al. | |
| 9,117,798 B2 | 8/2015 | Park et al. | |
| 2001/0001050 A1 | 5/2001 | Miyashita et al. | |
| 2002/0047514 A1* | 4/2002 | Sakurai | H01L 27/3246 313/503 |
| 2002/0149710 A1* | 10/2002 | Kim | H01L 27/1288 349/43 |
| 2003/0127657 A1* | 7/2003 | Park | H01L 27/3246 257/79 |
| 2003/0142043 A1 | 7/2003 | Matsueda | |
| 2007/0108899 A1 | 5/2007 | Jung et al. | |
| 2007/0252518 A1 | 11/2007 | Lee et al. | |
| 2008/0035932 A1* | 2/2008 | Oh | H01L 29/04 257/72 |
| 2008/0197342 A1* | 8/2008 | Lee | H01L 27/3244 257/40 |
| 2008/0277666 A1* | 11/2008 | Jeon | H01L 27/3244 257/66 |
| 2008/0303424 A1 | 12/2008 | Mitsuya et al. | |
| 2009/0140648 A1* | 6/2009 | Tohyama | H01L 51/56 313/505 |
| 2010/0072464 A1* | 3/2010 | Kasahara | H01L 27/3246 257/40 |
| 2010/0193791 A1 | 8/2010 | Chun | |
| 2010/0207149 A1* | 8/2010 | Kim | H01L 51/5271 257/98 |
| 2011/0198598 A1 | 8/2011 | Kim et al. | |

FOREIGN PATENT DOCUMENTS

| | | | |
|---|---|---|---|
| JP | 2008-091072 A | | 4/2008 |
| JP | 2008-270118 A | | 11/2008 |
| KR | 1999-0081916 A | | 11/1999 |
| KR | 10-2002-0041301 A | | 6/2002 |
| KR | 10-2002-0079187 A | | 10/2002 |
| KR | 10-2003-0047848 A | | 6/2003 |
| KR | 10-2004-0000629 A | | 1/2004 |
| KR | 20050081219 A | * | 8/2005 |
| KR | 10-2007-0106240 A | | 11/2007 |
| KR | 10-0918405 B1 | | 9/2009 |
| KR | 10-2009-0128511 A | | 12/2009 |
| TW | 201036171 | | 10/2010 |

OTHER PUBLICATIONS

Chinese Final Registration No. CN 102544058 B dated Jan. 20, 2016, which shares priority of Korean Patent Application No. KR 10-2010-0138038.
Korean Notice of Allowance dated Jan. 1, 2018 for Korean Patent Application No. KR 10-2010-0138038.
Korean Office Action dated May 22, 2017 for Korean Patent Application No. KR 10-2010-0138038.

* cited by examiner

ORGANIC LIGHT EMITTING DISPLAY APPARATUS AND METHOD OF MANUFACTURING THE ORGANIC LIGHT EMITTING DISPLAY APPARATUS

CROSS-REFERENCE TO RELATED PATENT APPLICATION

This application is a divisional of U.S. patent application Ser. No. 13/244,205, filed on Sep. 23, 2011, which claims the benefit of Korean Patent Application No. 10-2010-0138038, filed on Dec. 29, 2010, the disclosures of which are hereby incorporated by reference in their entireties.

BACKGROUND

Field

The present disclosure relates to an organic light emitting display apparatus and a method of manufacturing the organic light emitting display apparatus, and more particularly, to an organic light emitting display apparatus providing an improved image quality.

Description of the Related Technology

Display apparatuses have been recently being replaced by thin flat panel display apparatuses that are portable. Organic light-emitting display apparatuses from among flat panel display apparatuses are self-emission display apparatuses and have a larger viewing angle, better contrast characteristics, and a faster response rate than other display apparatuses, and thus have drawn attention as a next-generation display apparatus.

Organic light emitting display apparatuses have an intermediate layer, a first electrode, and a second electrode. The intermediate layer includes an organic emission layer, and generates visible light when the first electrode and the second electrode are supplied with a voltage.

Since it is not easy for the visible light generated by the intermediate layer to have uniform characteristics, organic light-emitting display apparatuses have a limit in improving the image quality.

SUMMARY OF CERTAIN INVENTIVE ASPECTS

An aspect of the present invention provides an organic light emitting display apparatus capable of easily improving image quality characteristics, and a method of manufacturing the organic light emitting display apparatus.

According to an aspect of the present invention, there is provided an organic light emitting display apparatus comprising a substrate; a thin film transistor which is disposed over the substrate; a first electrode which is disposed over the substrate and electrically connected to the thin film transistor; a passivation layer which covers the thin film transistor and contacts a predetermined region of an upper surface of the first electrode; an intermediate layer which is disposed over the first electrode, comprises an organic emission layer, and contacts a predetermined region of the passivation layer; and a second electrode which is disposed over the intermediate layer.

An edge region of the intermediate layer may be separated from the first electrode.

The passivation layer may comprise a protrusion that contacts the first electrode, and the protrusion may be disposed between the intermediate layer and the first electrode so that the edge region of the intermediate layer is separated from the first electrode.

The passivation layer may comprise an inorganic material.

The passivation layer may comprise an oxide or a nitride.

The organic light emitting display apparatus may further comprise a pixel defining layer which is disposed over the passivation layer, wherein the pixel defining layer is separated from the intermediate layer.

The pixel defining layer may comprise an organic material.

The pixel defining layer may have a width smaller than that of the passivation layer so as not to overpass an edge of the passivation layer.

The thin film transistor may comprise an active layer, a gate electrode insulated from the active layer, a source electrode, and a drain electrode. The first electrode may be electrically connected to the drain electrode.

A gate insulating layer may be disposed between the active layer and the gate electrode, and an interlayer insulating layer may be disposed between the gate electrode and the source electrode and between the gate electrode and the drain electrode. The gate insulating layer and the interlayer insulating layer may be covered with the passivation layer without extending beyond the boundary of the passivation layer.

The drain electrode and the first electrode may be connected to each other by a connection portion.

The connection portion may be formed of a material same as a material used to form the source electrode or the drain electrode.

The first electrode may contact the substrate.

According to another aspect of the present invention, there is provided a method of manufacturing an organic light emitting display apparatus, the method comprising forming a thin film transistor and a first electrode electrically connected to the thin film transistor, over the substrate; forming a passivation layer which covers the thin film transistor and contacts a predetermined region of an upper surface of the first electrode; forming an intermediate layer over the first electrode, the intermediate contacting a predetermined region of the passivation layer and comprising an organic emission layer; and forming a second electrode over the intermediate layer.

The method may further comprise forming a pixel defining layer over the passivation layer, wherein the pixel defining layer is separated from the intermediate layer, and disposed between the passivation layer and the second electrode. The forming of the passivation layer may comprise depositing a material used to form the passivation layer, and patterning the material by using the pixel defining layer as a mask.

The method may further comprise performing a plasma processing process after forming the pixel defining layer and before forming the intermediate layer.

The forming of the thin film transistor may comprise forming an active layer separated from the first electrode, over the substrate; forming a gate electrode insulated from the active layer; and forming a source electrode and a drain electrode which are separated from the gate electrode and are connected to a predetermined region of the active layer.

The forming of the thin film transistor may further comprise forming a gate insulating layer between the active layer and the gate electrode so as to cover a predetermined region of the first electrode; and forming an interlayer insulating layer between the gate electrode and the source electrode and between the gate electrode and the drain electrode. The passivation layer may cover the gate insulating layer and the interlayer insulating layer so that the gate insulating layer and the interlayer insulating layer does not extend the boundary of the passivation layer.

The intermediate layer may be formed by printing.

BRIEF DESCRIPTION OF THE DRAWINGS

The above and other features and advantages of the present invention will become more apparent by describing in detail embodiments thereof with reference to the attached drawings in which.

DETAILED DESCRIPTION OF CERTAIN INVENTIVE EMBODIMENTS

Hereinafter, embodiments of the present invention are described more fully with reference to the accompanying drawings, in which embodiments of the invention are shown.

Figure 1:
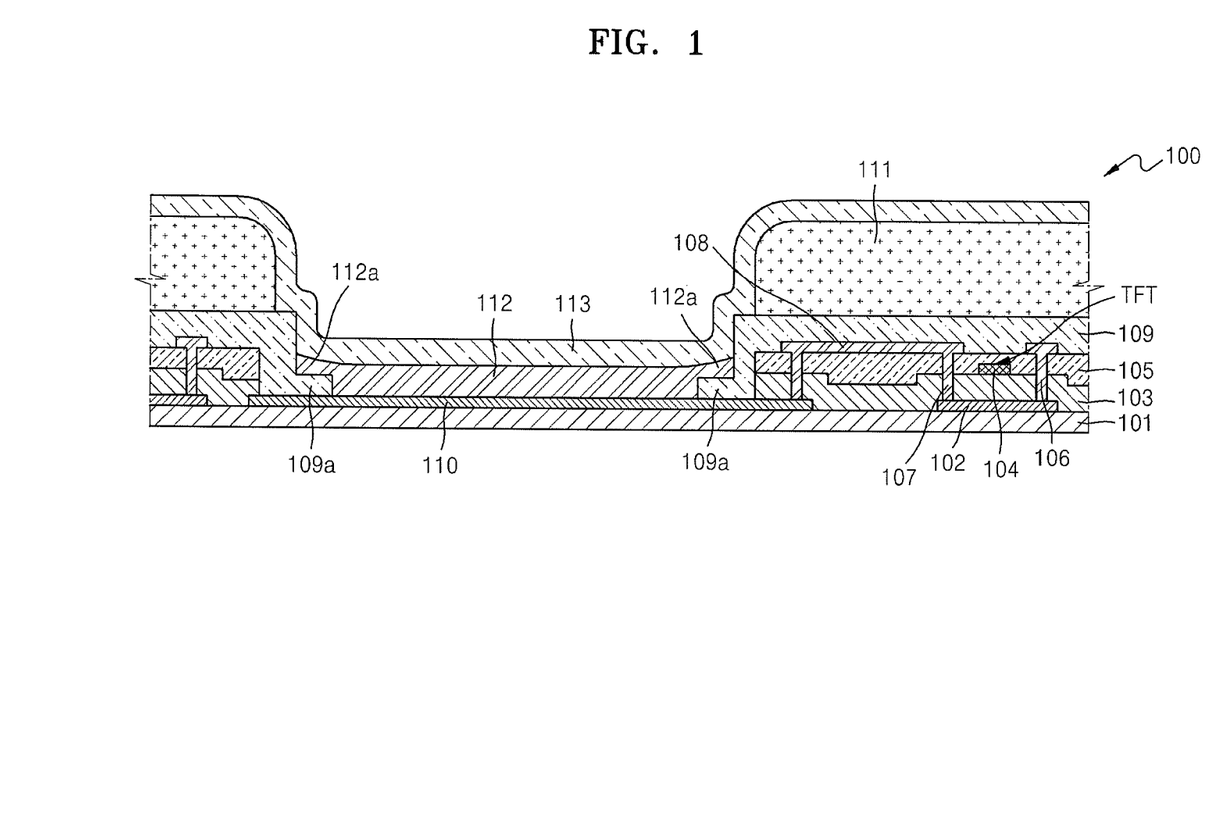
FIG. 1 is a schematic cross-sectional view of an organic light emitting display apparatus according to an embodiment of the present invention.

FIG. 1 is a schematic cross-sectional view of an organic light emitting display apparatus 100 according to an embodiment of the present invention.

Referring to FIG. 1, the organic light emitting display apparatus 100 includes a substrate 101, a thin film transistor TFT, a first electrode 110, a passivation layer 109, an intermediate layer 112, and a second electrode 113. The thin film transistor TFT includes an active layer 102, a gate electrode 104, a source electrode 106, and a drain electrode 107.

Compositions of the respective components of the organic light emitting display apparatus 100 are described in detail hereinafter.

The substrate 101 may be formed of a transparent glass material containing $SiO_2$ as a main component. However, the present invention is not limited thereto, and the substrate 101 may be formed of a transparent plastic material. The plastic material used to form the substrate 101 may be an organic insulating material selected from the group consisting of polyethersulphone (PES), polyacrylate (PAR), polyetherimide (PEI), polyethyelenen napthalate (PEN), polyethyelenetereptphalate (PET), polyphenylene sulfide (PPS), polyallylate, polyimide, polycarbonate (PC), cellulose triacetate (TAC), and cellulose acetate propionate (CAP).

The thin film transistor TFT and the first electrode 110 are formed on the substrate 101. The thin film transistor TFT and the first electrode 110 are electrically connected to each other. The thin film transistor TFT includes the active layer 102, the gate electrode 104, the source electrode 106, and the drain electrode 107.

The thin film transistor TFT and the first electrode 110 are described in detail hereinafter.

An active layer 102 having a predetermined pattern is formed on the substrate 101. The active layer 102 may be formed of an inorganic semiconductor material, such as amorphous silicon or polysilicon, or an organic semiconductor material. The active layer 102 includes a source region, a drain region, and a channel region between the source and drain regions.

The first electrode 110 is formed on the substrate 101 at a position spaced from the active layer 102, and separated from the active layer 102.

A gate insulating layer 103 is formed on the active layer 102. The gate insulating layer 103 covers a predetermined region of the first electrode 110.

The gate electrode 104 is formed on a predetermined region of the upper surface of the gate insulating layer 103. The gate electrode 104 is connected to a gate line (not shown) that applies a TFT ON/OFF signal. The gate electrode 104 may be formed of metal or a metal alloy such as gold (Au), silver (Ag), copper (Cu), nickel (Ni), platinum (Pt), palladium (Pd), aluminum (Al), molybdenum (Mo), an Al:neodymium (Nd) alloy, an Mo:tungsten (W) alloy, or the like, but the present invention is not limited thereto.

An interlayer insulating layer 105 is formed on the gate electrode 104. The interlayer insulating layer 105 exposes source and drain regions of the active layer 102. The source electrode 106 and the drain electrode 107 are formed to contact the exposed source and drain regions, respectively, of the active layer 102.

The drain electrode 107 is electrically connected to the first electrode 110 by a connection portion 108. In detail, after the gate insulating layer 103 and the interlayer insulating layer 105 are formed so that a predetermined region of the first electrode 110 is exposed, the connection portion 108 is formed on the exposed predetermined region of the first electrode 110. The connection portion 108 may be formed of the same material as a material used to form the source electrode 106 or the drain electrode 107.

The passivation layer 109 is formed to cover the thin film transistor TFT. The passivation layer 109 includes a protrusion 109a. The protrusion 109a protrudes from a lateral surface of the passivation layer 109. The protrusion 109a contacts the first electrode 110.

The passivation layer 109 covers the interlayer insulating layer 105 and the gate insulating layer 103. Accordingly, the gate insulating layer 103 and the interlayer insulating layer 105 do not extend beyond the boundary of the passivation layer 109. The passivation layer 109 contains an inorganic material, for example, an oxide or a nitride. In detail, the passivation layer 109 may contain silicon oxide or silicon nitride.

A pixel defining layer 111 is formed on the passivation layer 109. The pixel defining layer 111 is formed not to overpass the edge of the passivation layer 109. In other words, the pixel defining layer 111 is formed to have a width smaller than that of the passivation layer 109. The pixel defining layer 111 is spaced apart from the first electrode 110. The pixel defining layer 111 contains an organic material.

The intermediate layer 112 is formed on the first electrode 110. The intermediate layer 112 includes an organic emission layer (not shown) that emits visible light. The intermediate layer 112 may be formed by using any of various methods, for example, a printing method.

The intermediate layer 112 is spaced apart from the pixel defining layer 111. An edge region 112a of the intermediate layer 112 is spaced apart from the first electrode 110. In other words, the protrusion 109a of the passivation layer 109 is disposed between the edge region 112a of the intermediate layer 112 and the first electrode 110, so that the edge region 112a is separated from the first electrode 110.

The second electrode 113 is formed on the intermediate layer 112. The second electrode 113 may be formed on the entire regions of the intermediate layer 112 and the pixel defining layer 111. When a voltage is applied via the first electrode 110 and the second electrode 113, the organic emission layer of the intermediate layer 112 emits visible light.

A sealing member (not shown) may be disposed on the second electrode 113. The sealing member is formed to protect the intermediate layer 112 and the other layers from external moisture, oxygen, or the like, and is formed of a transparent material. To this end, the sealing member may include glass or plastic or have a structure in which an organic material and an inorganic material are stacked in multiple layers.

In the organic light emitting display apparatus 100 according to the present embodiment, the edge region 112a of the intermediate layer 112 is separated from the first electrode 110 via the protrusion 109a of the passivation layer 109. In a display panel, for example, the edge region of an intermediate layer sometimes has abnormal electrical characteristics, and thus an image quality is not uniform. However, in an embodiment of the present invention, since the edge region 112a of the intermediate layer 112 is separated from the first electrode 110, the edge region 112a of the intermediate layer 112 is prevented from having abnormal electrical characteristics. Consequently, the entire region of the intermediate layer 112 may provide a uniform image quality.

In addition, in the organic light emitting display apparatus 100 according to the present embodiment, the first electrode 110 is formed on the substrate 101. The visible light generated by the intermediate layer 112 may show variable optical characteristics while passing through various layers. Thus, optical characteristics sensible by users may be reduced. In the present embodiment, no insulating layers exist between the first electrode 110 and the substrate 101. Accordingly, light traveling toward the substrate 101 from among the visible light generated by the intermediate layer 112 is not interfered with other insulating layers or not lost. In particular, when the organic light emitting display apparatus 100 is of bottom emission type, that is, when the organic light emitting display apparatus 100 is an apparatus in which the visible light generated by the intermediate layer 112 is recognized by a user through the substrate 101, the visible light generated by the intermediate layer 112 is recognized by the user without being lost due to interference, resonance, or the like. Thus, the image quality of the organic light emitting display apparatus 100 is improved.

When the pixel defining layer 111 is formed on the passivation layer 109, the pixel defining layer 111 is formed to be separated from the first electrode 110, thereby preventing bad patterning and non-uniform formation of the intermediate layer 112. In other words, when the intermediate layer 112 is formed on the first electrode 110 during patterning of the intermediate layer 112, the intermediate layer 112 is easily prevented from contacting the pixel defining layer 111.

In a display panel, for example, when an intermediate layer contacts a lateral surface of a pixel defining layer, a difference between the thicknesses of a portion close to the pixel defining layer and a portion spaced away from the pixel defining layer among the region of the intermediate layer increases. Thus, improving emission properties is not easy due to the non-uniform thickness of the intermediate layer. This is because contact between the intermediate layer and the pixel defining layer is significantly different from contact between the intermediate layer and a first electrode. In particular, when the surfaces of the first electrode and the pixel defining layer are processed using plasma or the like before the formation of the intermediate layer, the non-uniformity of the thickness of the intermediate layer increases. However, in embodiments of the present invention, the pixel defining layer 111 is disposed on the upper surface of the passivation layer 109 and the intermediate layer 112 is spaced apart from the pixel defining layer 111, thereby preventing the thickness of the intermediate layer 112 from being non-uniform. In particular, the passivation layer 109 contains an inorganic material, and thus more easily contacts the intermediate layer 112 than the pixel defining layer 111.

FIGS. 2A through 2I are cross-sectional views for describing a method of manufacturing the organic light emitting display apparatus 100, according to an embodiment of the present invention. The components shown in FIGS. 2A through 2I are the same as the components shown in FIG. 1. The method is described with reference to FIGS. 2A through 2I hereinafter.

Figure 2A:
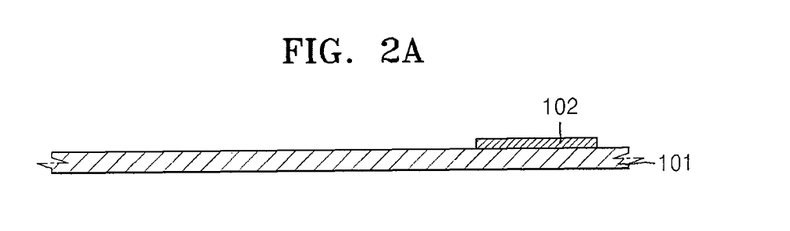
FIGS. 2A through 2I are cross-sectional views for describing a method of manufacturing an organic light emitting display apparatus, according to an embodiment of the present invention.

Referring to FIG. 2A, the active layer 102 having a predetermined pattern is formed on the substrate 101. The active layer 102 may be formed of an inorganic semiconductor material, such as amorphous silicon or polysilicon, or an organic semiconductor material. The active layer 102 includes a source region, a drain region, and a channel region between the source and drain regions.

Figure 2B:
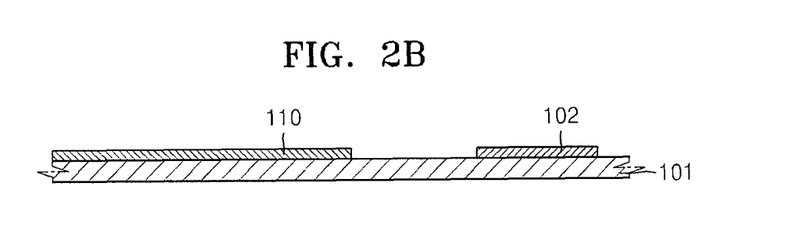

Referring to FIG. 2B, the first electrode 110 is formed on the substrate 101 at a position spaced from the active layer 102, and separated from the active layer 102. The first electrode 110 contains a transmissive conductive material. In detail, the first electrode 110 contains ITO. Although the first electrode 110 is formed after the formation of the active layer 102 in the present embodiment, the present invention is not limited thereto. In other words, the active layer 102 may be formed after the first electrode 110 is formed.

Figure 2C:
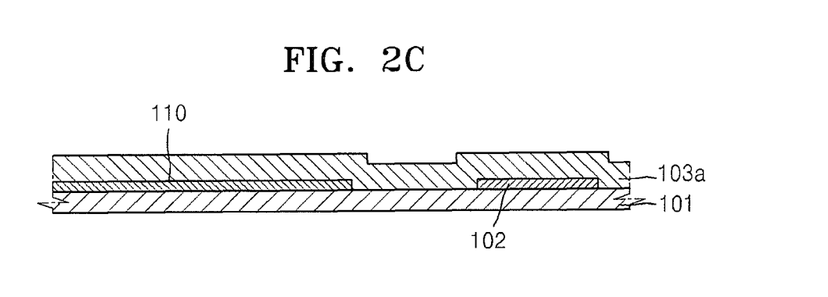

Thereafter, referring to FIG. 2C, a first insulating material layer 103a used to form the gate insulating layer 103 is formed on the active layer 102 and the first electrode 110. Various materials may be used to form the first insulating material layer 103a.

Figure 2D:
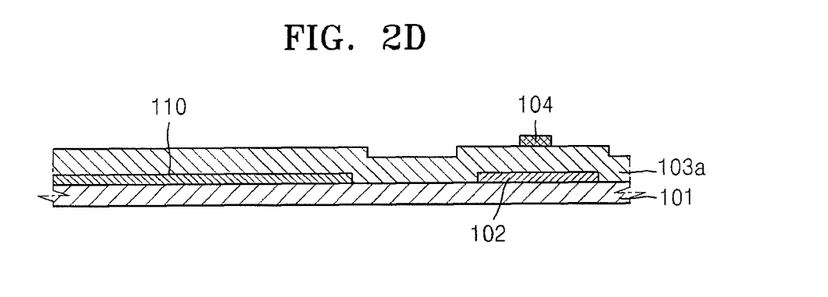

Thereafter, referring to FIG. 2D, the gate electrode 104 is formed on a predetermined region of the upper surface of the first insulating material layer 103a so as to be overlapped with the active layer 102. The gate electrode 104 is insulated from the active layer 102 by the first insulating material layer 103a.

Figure 2E:
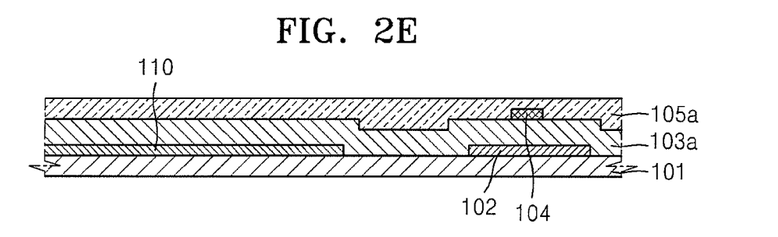

Thereafter, referring to FIG. 2E, a second insulating material layer 105a used to form the interlayer insulating layer 105 is formed on the gate electrode 104.

Figure 2F:
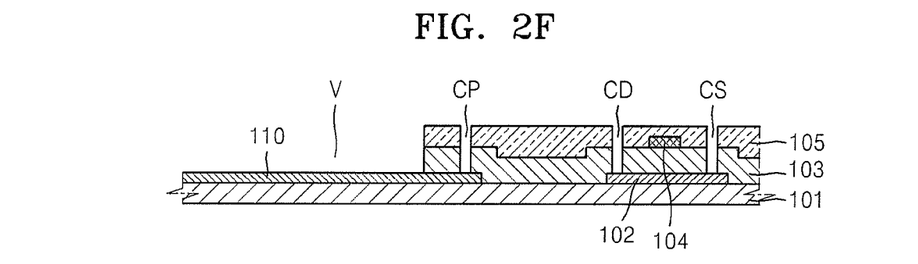

Thereafter, referring to FIG. 2F, the gate insulating layer 103 and the interlayer insulating layer 105 are formed by patterning the first and second insulating material layers 103a and 105a, respectively. A source contact hole CS, a drain contact hole CD, a connection hole CP, and a via hole V are formed in the gate insulating layer 103 and the interlayer insulating layer 105.

The source contact hole CS and the drain contact hole CD are formed to expose predetermined regions of the active layer 102. The source electrode 106 and the drain electrode 107 are connected to the source contact hole CS and the drain contact hole CD through a subsequent process.

The connection hole CP and the via hole V are formed to expose predetermined regions of the first electrode 110. The intermediate layer 112 is formed in the via hole V through a subsequent process.

The first insulating material layer 103a and the second insulating material layer 105a may be patterned simultaneously. This results in the improvement of process convenience.

Figure 2G:
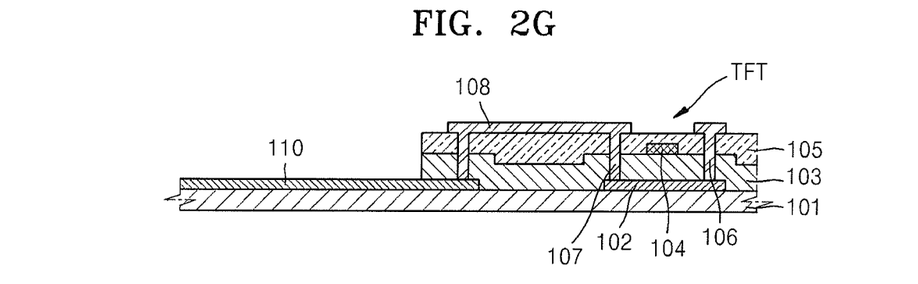

Thereafter, referring to FIG. 2G, the source electrode 106 and the drain electrode 107 are formed to contact the exposed regions of the active layer 102, thereby completing the formation of the thin film transistor TFT. The thin film transistor TFT includes the active layer 102, the gate electrode 104, the source electrode 106, and the drain electrode 107.

In one embodiment, referring to FIG. 2G, the source electrode 106 is formed to correspond to the source contact hole CS, and the drain electrode 107 is formed to correspond to the drain contact hole CD.

The connection portion 108 is formed to correspond to the connection hole CP. The connection portion 108 is also connected to one end of the drain electrode 107. The drain electrode 107 is electrically connected to the first electrode 110 by the connection portion 108.

The connection portion 108 may be formed of the same material as a material used to form the source electrode 106 or the drain electrode 107. In detail, the source electrode 106, the drain electrode 107, and the connection portion 108 may be formed of the same material, and may be formed by one patterning process.

Figure 2H:
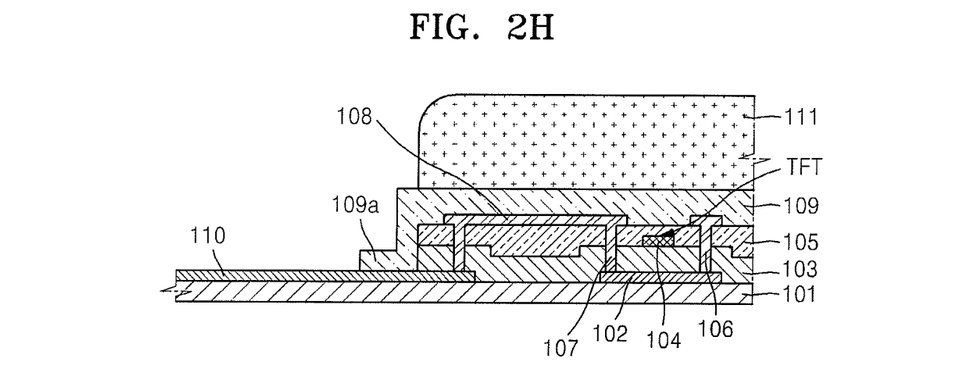

Thereafter, referring to FIG. 2H, the passivation layer 109 is formed so as to cover the thin film transistor TFT, and the pixel defining layer 111 is formed on the passivation layer 109. The passivation layer 109 includes the protrusion 109a, and the protrusion 109a protrudes from the lateral surface of the passivation layer 109. The protrusion 109a contacts the first electrode 110.

The passivation layer 109 covers the interlayer insulating layer 105 and the gate insulating layer 103. Accordingly, the gate insulating layer 103 and the interlayer insulating layer 105 do not extend beyond the passivation layer 109. The passivation layer 109 contains an inorganic material, for example, an oxide or a nitride. In detail, the passivation layer 109 may contain silicon oxide or silicon nitride.

The pixel defining layer 111 is formed not to overpass the edge of the passivation layer 109. The pixel defining layer 111 is spaced apart from the first electrode 110. The pixel defining layer 111 contains an organic material.

A method of forming the passivation layer 109 and the pixel defining layer 111 is described in detail hereinafter. First, in one embodiment, a material used to form the passivation layer 109 is deposited on the TFT without patterning, and then a material used to form the pixel defining layer 111 is deposited on the material used to form the passivation layer 109 without patterning. Thereafter, the pixel defining layer 111 is formed by patterning the deposited material, and the passivation layer 109 is formed by patterning using the pixel defining layer 111 as a mask. When the deposited material used to form the passivation layer 109 is patterned, the edge of the pixel defining layer 111 is also partially etched out, so that the width of the pixel defining layer 111 is reduced and the pixel defining layer 111 does not overpass the edge of the passivation layer 109.

Figure 2I:
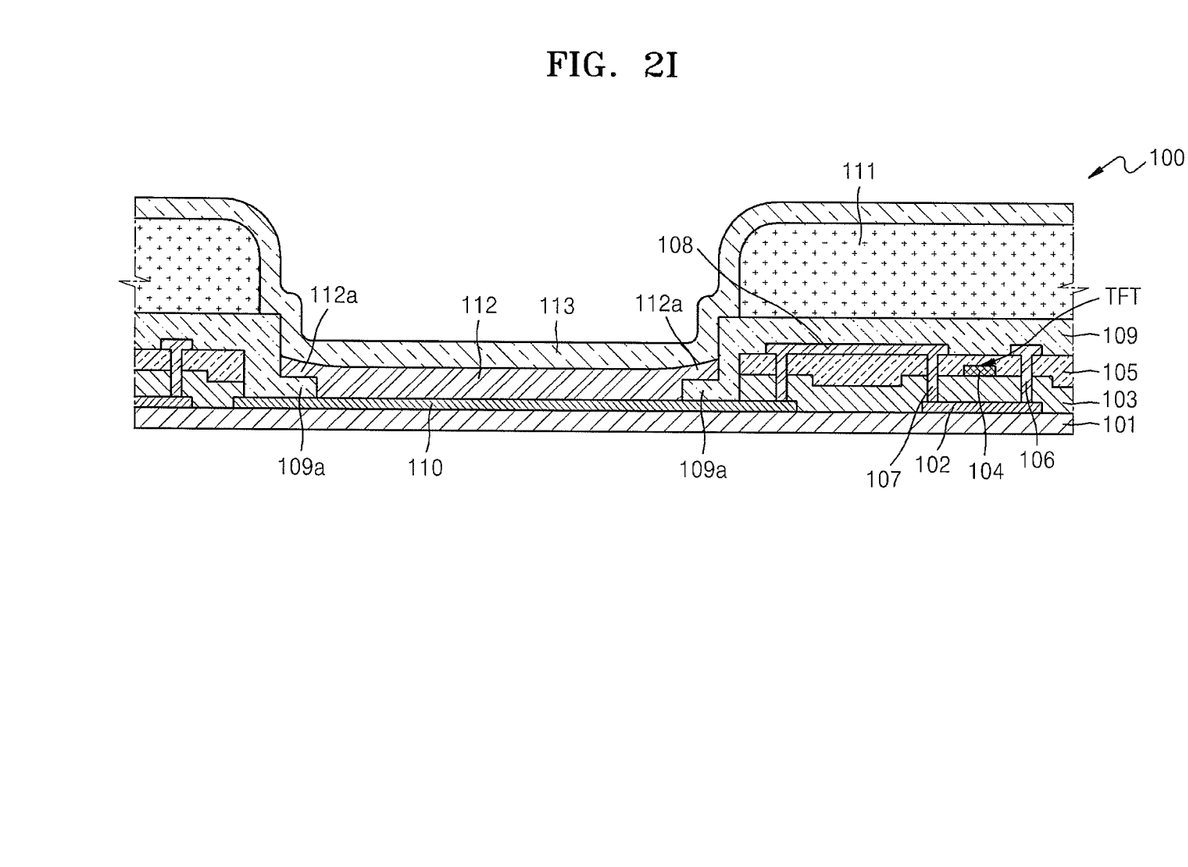

Thereafter, referring to FIG. 2I, the intermediate layer 112 and the second electrode 113 are formed on the first electrode 110, thereby finally manufacturing the organic light emitting display apparatus 100. The intermediate layer 112 includes an organic emission layer (not shown) that emits visible light. The intermediate layer 112 may be formed by using any of various methods, for example, a printing method. In detail, the intermediate layer 112 may be formed by using an inkjet printing method.

A plasma surface-processing process may be performed before the intermediate layer 112 is formed. In other words, the upper surface of the first electrode 110 and the exposed surface of the pixel defining layer 111 may be plasma-processed. Accordingly, contact between the intermediate layer 112 and the first electrode 110 is improved.

The intermediate layer 112 is spaced and separated from the pixel defining layer 111 by the passivation layer 109. In particular, the intermediate layer 112 is more effectively separated from the pixel defining layer 111 by using the plasma processing on the surface of the pixel defining layer 111.

The edge region 112a of the intermediate layer 112 is spaced apart from the first electrode 110. In other words, the protrusion 109a of the passivation layer 109 is disposed between the edge region 112a of the intermediate layer 112 and the first electrode 110, so that the edge area 112a is separated from the first electrode 110.

The second electrode 113 is formed on the intermediate layer 112. The second electrode 113 may be formed on the entire regions of the intermediate layer 112 and the pixel defining layer 111. When a voltage is applied via the first electrode 110 and the second electrode 113, the organic emission layer of the intermediate layer 112 emits visible light.

Although not shown in FIG. 2I, a sealing member (not shown) may be disposed on the second electrode 113.

In the method of manufacturing the organic light emitting display apparatus 100 according to the present embodiment, the edge region 112a of the intermediate layer 112 is separated from the first electrode 110 via the extension 109a of the passivation layer 109. Accordingly, the edge region 112a of the intermediate layer 112 is separated from the first electrode 110, so that the edge region 112a of the intermediate layer 112 is prevented from having abnormal electrical characteristics. Consequently, the entire region of the intermediate layer 112 may provide a uniform image quality.

In addition, since the passivation layer 109 is formed through patterning by using the patterned pixel defining layer 111 as a mask without needing a special mask, the convenience of a process is improved.

Moreover, in the method of manufacturing the organic light emitting display apparatus 100 according to the present embodiment, since the first electrode 110 is formed on the substrate 101, the visible light generated by the intermediate layer 112 is recognized by a user without being lost due to interference, resonance, or the like. Thus, the image quality of the organic light emitting display apparatus 100 is improved. In particular, when the organic light emitting display apparatus 100 is a bottom emission type apparatus, the improvement of the image quality can be significant.

In addition, the pixel defining layer 111 is formed to have a width smaller than that of the passivation layer 109 so as not to extend beyond the edge of the passivation layer 109. The pixel defining layer 111 is spaced apart from the first electrode 110. Accordingly, bad patterning and non-uniform formation of the intermediate layer 112 are prevented. In other words, when the intermediate layer 112 is formed on the first electrode 110 during patterning of the intermediate layer 112, the intermediate layer 112 is easily prevented from being formed even on the upper surface of the pixel defining layer 111.

In a display panel, for example, when an intermediate layer contacts a lateral surface of a pixel defining layer, a difference between the thicknesses of a portion close to the pixel defining layer and a portion spaced away from the pixel defining layer among the region of the intermediate layer increases. Thus, improvement of emission properties is not easy due to the non-uniform thickness of the intermediate layer. In particular, when the surfaces of an first electrode and the pixel defining layer are processed using plasma or the like before the formation of the intermediate layer, formation of the intermediate layer on the upper surface of the pixel defining layer may be prevented, but the non-uniformity of the thickness of the intermediate layer increases.

However, in embodiments of the present invention, the pixel defining layer 111 is disposed on the upper surface of the passivation layer 109 and the intermediate layer 112 is spaced apart from the pixel defining layer 111, thereby preventing the thickness of the intermediate layer 112 from being non-uniform. In particular, the passivation layer 109 contains an inorganic material, and thus more easily contacts the intermediate layer 112 than the pixel defining layer 111.

An organic light emitting display apparatus and a manufacturing method thereof according to embodiments of the present invention can easily improve image quality characteristics.

While embodiments of the present invention has been particularly shown and described, it will be understood by those of ordinary skill in the art that various changes in form and details may be made therein without departing from the spirit and scope of the present invention as defined by the following claims.

What is claimed is:

1. A method of manufacturing an organic light emitting display apparatus, the method comprising:
   providing a substrate having a horizontal main surface;
   forming a thin film transistor over the substrate, the thin film transistor having an active layer formed at a vertical level in a vertical direction perpendicular to the horizontal main surface, and a gate insulating layer formed on the active layer;
   forming a first electrode electrically connected to the thin film transistor, wherein a connection portion electrically connects the first electrode to the thin film transistor;
   forming a passivation layer over the thin film transistor and contacting an upper surface of the first electrode;
   forming a pixel defining layer over the passivation layer;
   forming an intermediate layer comprising an organic emission layer over the first electrode; and
   forming a second electrode over the intermediate layer,
   wherein the passivation layer includes at least one protrusion extending laterally and having a side surface and a top surface,
   wherein the side surface of the at least one protrusion is connected to the top surface of the at least one protrusion, wherein the side surface of the at least one protrusion is not covered with the pixel defining layer,
   wherein at least a region of the top surface of the at least one protrusion is not covered with pixel defining layer,
   and wherein the at least a region of the top surface of the at least one protrusion is covered with the intermediate layer, wherein the passivation layer directly contacts the gate insulating layer, wherein a portion of the gate insulating layer is between a portion of the connection portion and the passivation layer, wherein the portion of the gate insulating layer directly contacts the passivation layer and the portion of the connection portion, wherein the portion of the gate insulating layer is disposed on the upper surface of the first electrode,
   wherein a first side surface of the portion of the gate insulating layer directly contacts the passivation layer, wherein the first side surface of the portion of the gate insulating layer extends in the vertical direction, wherein the first side surface of the portion of the gate insulating layer is a side surface of the gate insulating layer that is nearest to the intermediate layer, wherein a second side surface, opposite to the first side surface, of the portion of the gate insulating layer directly contacts the portion of the connection portion, and wherein the first and second side surfaces of the portion of the gate insulating layer vertically overlap the first electrode.

2. The method of claim 1, forming the pixel defining layer comprises patterning a pixel defining material, and forming the passivation layer comprises patterning a passivation material using the patterned pixel defining material as a mask.

3. The method of claim 2, wherein patterning the passivation material further comprises reducing a width of the pixel defining material to expose an edge portion of the underlying patterned passivation layer, and wherein the exposed edge portion of the passivation layer laterally separates the pixel defining layer and the intermediate layer.

4. The method of claim 3, wherein the edge portion comprises the at least one protrusion extending laterally away from the thin film transistor and directly on and contacting the first electrode.

5. The method of claim 4, wherein forming the thin film transistor further comprises:
   forming the gate insulating layer between the active layer and a gate electrode such that the gate insulating layer covers a predetermined region of the first electrode; and
   forming an interlayer insulating layer between the gate electrode and a source electrode and between the gate electrode and a drain electrode,
   wherein the passivation layer covers the gate insulating layer and the interlayer insulating layer such that the gate insulating layer and the interlayer insulating layer do not extend beyond boundaries of the passivation layer.

6. The method of claim 1, wherein the first electrode and the thin film transistor are formed in contact with the horizontal main surface.

7. The method of claim 1, wherein the passivation layer completely covers the thin film transistor above the substrate.

8. The method of claim 1, further comprising, prior to forming the intermediate layer, plasma-processing an exposed surface of the first electrode and an exposed surface of the pixel defining layer.

9. The method of claim 1, wherein forming the thin film transistor comprises:
   forming the active layer separated from the first electrode, over the substrate;
   forming a gate electrode insulated from the active layer; and
   forming a source electrode and a drain electrode which are separated from the gate electrode and are connected to the active layer.

10. The method of claim 1, wherein the intermediate layer is formed using a printing method.

* * * * *